United States Patent
Lee et al.

(10) Patent No.: US 11,749,775 B2
(45) Date of Patent: *Sep. 5, 2023

(54) LIGHT SOURCE-INTEGRATED LIGHT SENSING SYSTEM AND ELECTRONIC DEVICE INCLUDING THE SAME

(71) Applicant: SAMSUNG ELECTRONICS CO., LTD., Suwon-si (KR)

(72) Inventors: Eunkyung Lee, Seoul (KR); Jungwoo Kim, Hwaseong-si (KR); Byounglyong Choi, Seoul (KR); Heesun Yoon, Incheon (KR); Inoh Hwang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 327 days.

This patent is subject to a terminal disclaimer.

(21) Appl. No.: 17/150,634

(22) Filed: Jan. 15, 2021

(65) Prior Publication Data

US 2021/0167241 A1  Jun. 3, 2021

Related U.S. Application Data

(63) Continuation of application No. 15/954,203, filed on Apr. 16, 2018, now Pat. No. 10,923,615.

(30) Foreign Application Priority Data

Oct. 11, 2017  (KR) .......................... 10-2017-0131654

(51) Int. Cl.
*G01C 3/08* (2006.01)
*H01L 31/173* (2006.01)
(Continued)

(52) U.S. Cl.
CPC .......... *H01L 31/173* (2013.01); *G01S 7/4811* (2013.01); *G01S 7/4812* (2013.01);
(Continued)

(58) Field of Classification Search
None
See application file for complete search history.

(56) References Cited

U.S. PATENT DOCUMENTS 5,319,182 A  6/1994  Havens
5,793,790 A  8/1998  Doi et al.
(Continued)

FOREIGN PATENT DOCUMENTS

AT  507 872 A1  8/2010
CN  103513236 A  1/2014
(Continued)

OTHER PUBLICATIONS

Communication dated Mar. 7, 2019 issued by the European Patent Office in European counterpart Application No. 18186133.7.
(Continued)

*Primary Examiner* — Mark Hellner
(74) *Attorney, Agent, or Firm* — Sughrue Mion, PLLC

(57) ABSTRACT

A light sensing system includes a plurality of light-emitting devices arranged to have a first optical axis and a plurality of light-receiving devices arranged to have a second optical axis, the second optical axis being parallel with the first optical axis. The plurality of light-emitting devices and the plurality of light-receiving devices are formed to have a monolithically integrated structure, and the first optical axis and the second optical axis are substantially coaxial to each other, thus improving the efficiency of light reception.

19 Claims, 10 Drawing Sheets

(51) Int. Cl.
    *H01L 31/0232* (2014.01)
    *G01S 7/481* (2006.01)
    *H01S 5/183* (2006.01)
    *H01L 31/105* (2006.01)
    *H01S 5/30* (2006.01)
    *H01S 5/34* (2006.01)
    *H01S 5/187* (2006.01)

(52) U.S. Cl.
    CPC ...... *H01L 31/02327* (2013.01); *H01L 31/105* (2013.01); *H01S 5/183* (2013.01); *H01S 5/187* (2013.01); *H01S 5/3013* (2013.01); *H01S 5/3018* (2013.01); *H01S 5/3402* (2013.01)

(56) References Cited

U.S. PATENT DOCUMENTS

| | | |
|---|---|---|
| 7,544,945 B2 | 6/2009 | Tan et al. |
| 8,301,027 B2 | 10/2012 | Shaw |
| 8,674,305 B2 | 3/2014 | Rossi et al. |
| 9,155,498 B2 | 10/2015 | Akiyama |
| 9,167,994 B2 | 10/2015 | Akiyama |
| 9,223,054 B2 | 12/2015 | Morita |
| 9,702,975 B2 | 7/2017 | Brinkmeyer et al. |
| 9,831,630 B2 | 11/2017 | Lipson |
| 10,923,615 B2 * | 2/2021 | Lee ............... H01L 31/02327 |
| 2012/0051383 A1 | 3/2012 | Stern |
| 2014/0071427 A1 * | 3/2014 | Last .................. G01S 17/89 29/592.1 |
| 2014/0071431 A1 | 3/2014 | Last |
| 2015/0219764 A1 | 8/2015 | Lipson |
| 2015/0340841 A1 | 11/2015 | Joseph |
| 2017/0307736 A1 | 10/2017 | Donovan |

FOREIGN PATENT DOCUMENTS

| | | |
|---|---|---|
| CN | 104054008 A | 9/2014 |
| CN | 104157665 A | 11/2014 |
| EP | 1467224 A1 | 10/2004 |
| JP | 61-52280 U | 4/1986 |
| JP | 61-267378 A | 11/1986 |
| JP | 62-199072 A | 9/1987 |
| JP | 8-288540 A | 11/1996 |
| JP | 3882210 B2 | 2/2007 |
| JP | 2007-214564 A | 8/2007 |
| JP | 2010-212347 A | 9/2010 |
| JP | 2013-73965 A | 4/2013 |
| JP | 2016-502073 A | 1/2016 |
| KR | 10-0363243 B1 | 2/2003 |
| WO | 93/01504 A2 | 1/1993 |
| WO | 2017/043706 A1 | 3/2017 |

OTHER PUBLICATIONS

Communication dated Aug. 2, 2022 by the Japanese Patent Office in Japanese Application No. 2018-188374.
Communication dated Aug. 23, 2022 by the Korean Intellectual Property Office in Korean Application No. 10-2017-0131654.
Communication dated Mar. 10, 2023 from the China National Intellectual Property Administration in Chinese Patent Application No. 201810538775.2.

\* cited by examiner

LIGHT SOURCE-INTEGRATED LIGHT SENSING SYSTEM AND ELECTRONIC DEVICE INCLUDING THE SAME

CROSS-REFERENCE TO RELATED APPLICATION

This application is a continuation of U.S. application Ser. No. 15/954,203, filed Apr. 16, 2018, which claims priority from Korean Patent Application No. 10-2017-0131654, filed on Oct. 11, 2017, in the Korean Intellectual Property Office, the disclosure of which is incorporated herein in its entirety by reference.

BACKGROUND

1. Field

Apparatuses consistent with exemplary embodiments relate to a light source-integrated light sensing system and an electronic device including the same.

2. Description of the Related Art

A light detection and ranging (LiDAR) system, used as a sensor or a scanner for detecting an obstacle in various autonomous driving device fields such as smart vehicles, robots, and so forth, will typically include a light source for irradiating laser light onto an object and a sensor for receiving light reflected from the object. Various additional optical parts are disposed on the light path between the light source and the object and the light path between the object and the sensor, making the system bulky and causing a loss of light when the light passes through these optical parts.

SUMMARY

One or more exemplary embodiments may provide a light source-integrated light sensing system capable of improving the efficiency of light reception.

One or more exemplary embodiments may provide a light detection and ranging (LiDAR) device capable of efficiently analyzing an object by including a light sensing system.

Additional exemplary aspects and advantages will be set forth in part in the description which follows and, in part, will be apparent from the description, or may be learned by practice of the presented exemplary embodiments.

According to an aspect of an exemplary embodiment, a light sensing system includes a substrate, a plurality of light-emitting devices disposed on the substrate and arranged to have a first optical axis, and a plurality of light-receiving devices disposed on the substrate and arranged to have a second optical axis that is parallel with the first optical axis.

The first optical axis and the second optical axis may be substantially coaxial to each other.

The plurality of light-emitting devices and the plurality of light-receiving devices may have a monolithically integrated structure.

The plurality of light-emitting devices and the plurality of light-receiving devices may be arranged such that a plurality of light receiving-emitting unit devices including one or more of the plurality of light-emitting devices and one or more of the plurality of light-receiving devices are arranged repeatedly.

Each of the plurality of light receiving-emitting unit devices may have a form in which the a plurality of the light-receiving devices surround the one or more light-emitting devices.

Each of the plurality of light receiving-emitting unit devices may include a light-emitting material layer, which is formed on the substrate and includes a light-emitting region including the one or more light-emitting devices and a non-emitting region including the same material as a material of the one or more light-emitting devices, and the one or more light-receiving devices formed on the non-emitting region.

Each of the plurality of light receiving-emitting unit devices may include a light-receiving material layer, which is formed on the substrate and includes a light-receiving region including the one or more light-receiving devices and a non-receiving region including the same material as a material of the one or more light-receiving devices, and the one or more light-emitting devices formed on the non-receiving region.

The light sensing system may further include a lens structure positioned on the light receiving-emitting unit device to adjust an emitting angle of light emitted from the one or more light-receiving devices.

The lens structure may adjust an incident angle of light toward the one or more light-receiving devices.

The lens structure may have a shape having a different emitting angle depending on a relative position of each of the plurality of light receiving-emitting unit devices.

The light sensing system may further include a support structure having a surface on which the plurality of light receiving-emitting unit devices are arranged, in which a shape of the surface is configured such that a direction of an optical axis of each of the plurality of light receiving-emitting unit devices differs with a position on the surface.

The surface may include a curved surface, or a plurality of inclined surfaces having different angles.

The plurality of light-emitting devices may include a first light-emitting device for emitting light in a first wavelength band and a second light-emitting device for emitting light in a second wavelength band, different from the first wavelength band.

According to an aspect of another exemplary embodiment, a light sensing system includes a plurality of light-emitting devices configured to irradiate light toward an object and a plurality of light-receiving devices configured to receive reflected light of the light irradiated toward the object, in which the plurality of light-emitting devices are arranged to have a first optical axis and the plurality of light-receiving devices are arranged to have a second optical axis, the first optical axis and the second optical axis being parallel to each other, and a processor configured to control the light sensing system and to analyze light received from the light sensing system.

The first optical axis of the plurality of light-emitting devices and the second optical axis of the plurality of light-receiving devices may be substantially coaxial.

The plurality of light-emitting devices and the plurality of light-receiving devices may be formed to have a monolithically integrated structure.

The plurality of light-emitting devices and the plurality of light-receiving devices may be arranged such that a plurality of light receiving-emitting unit devices including one or more of the plurality of light-emitting devices and one or more of the plurality of light-receiving devices are arranged repeatedly.

The processor may be further configured to control the light sensing system such that the plurality of light-emitting devices emit light at different times.

The processor may be further configured to control the light sensing system such that the plurality of light-emitting devices emit light at the same time.

The plurality of light-emitting devices may include a first light-emitting device configured to emit light in a first wavelength band, and a second light-emitting device configured to emit light in a second wavelength band, the second wavelength band being different from the first wavelength band.

The processor may be further configured to control the light sensing system such that the first light-emitting device and the second light-emitting device emit light at different times.

BRIEF DESCRIPTION OF THE DRAWINGS

These and/or other exemplary aspects and advantages will become apparent and more readily appreciated from the following description of the exemplary embodiments, taken in conjunction with the accompanying drawings in which:

FIG. 3b shows modified example of FIG. 3a;

FIG. 4a is a cross-sectional view showing a modified example of the light receiving-emitting unit device of FIG. 3a and FIG. 4b shows modified example of FIG. 4a;

DETAILED DESCRIPTION

Figure 1:
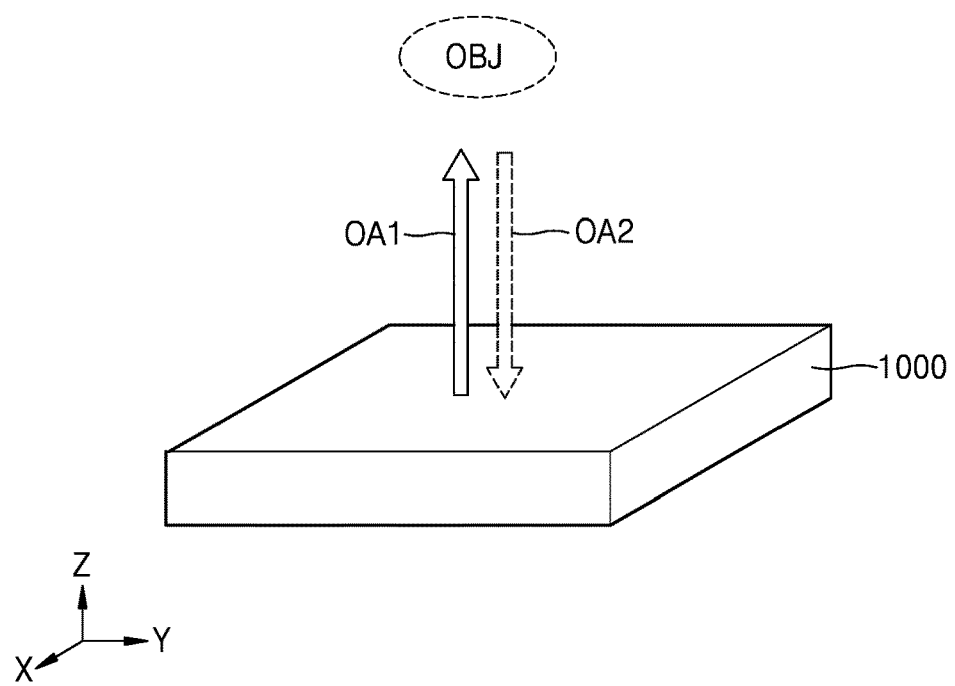
FIG. 1 is a conceptual view of a light sensing system according to an exemplary embodiment.

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. Expressions such as "at least one of," when preceding a list of elements, modify the entire list of elements and do not modify the individual elements of the list.

Hereinafter, exemplary embodiments will be described with reference to the accompanying drawings. Throughout the drawings, like reference numerals refer to like elements, and each element may be exaggerated in size for clarity and convenience of a description. Meanwhile, the following exemplary embodiments are merely illustrative, and various modifications may be possible from the exemplary embodiments.

An expression describing a first object or element as "above" or "on" a second object or element may include not only the meaning of the first object or element being disposed immediately on and contacting the second object or element, but also the meaning of the first object or element being disposed on, but not contacting the second object or element.

Terms such as first, second, and the like may be used to describe various elements, but the elements should not be limited to those terms. These terms may be used for the purpose of distinguishing one element from another element.

The singular forms are intended to include the plural forms as well, unless the context clearly indicates otherwise. If it is assumed that a certain part includes a certain component, the term "including" means that a corresponding component may further include other components unless a specific meaning opposed to the corresponding component is written.

The term used in the exemplary embodiments such as "unit" or "module" indicates a unit for processing at least one function or operation, and may be implemented in hardware, software, or in a combination of hardware and software.

Figure 2:
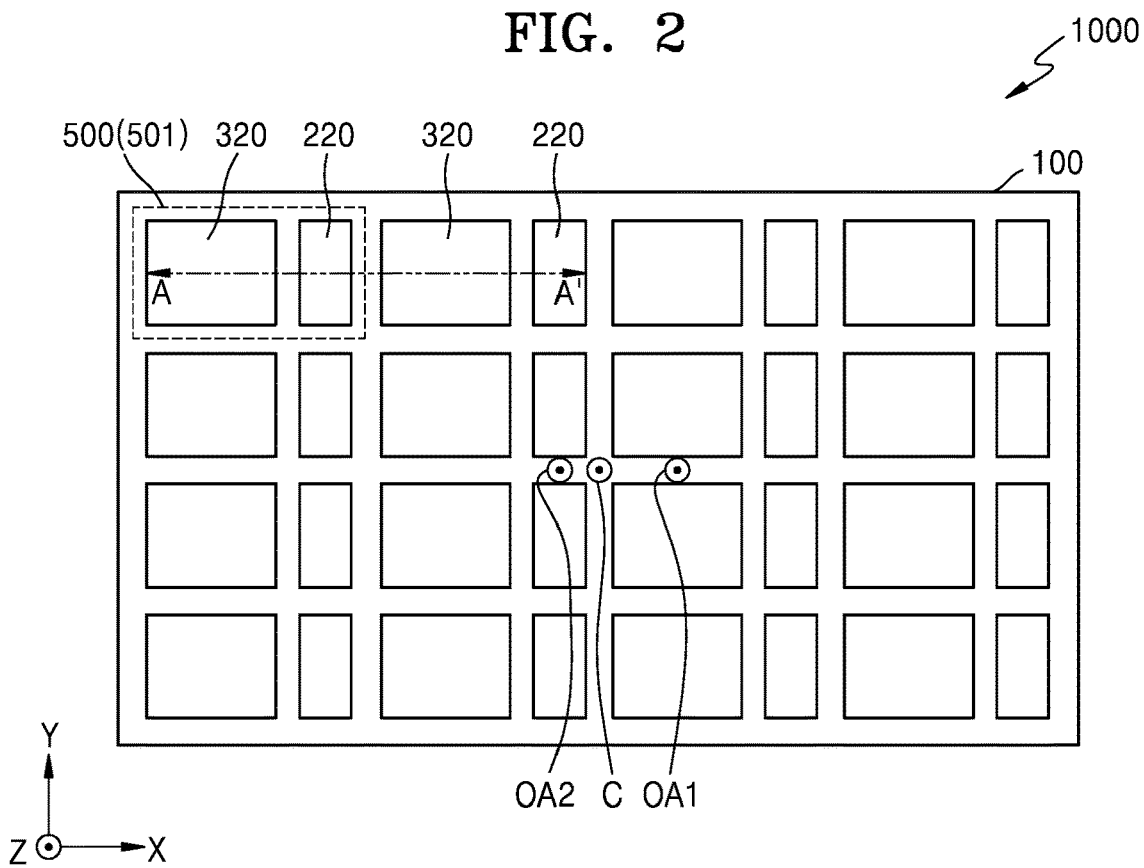
FIG. 2 is a plan view showing a schematic configuration of the light sensing system of FIG. 1.
Figure 3A:
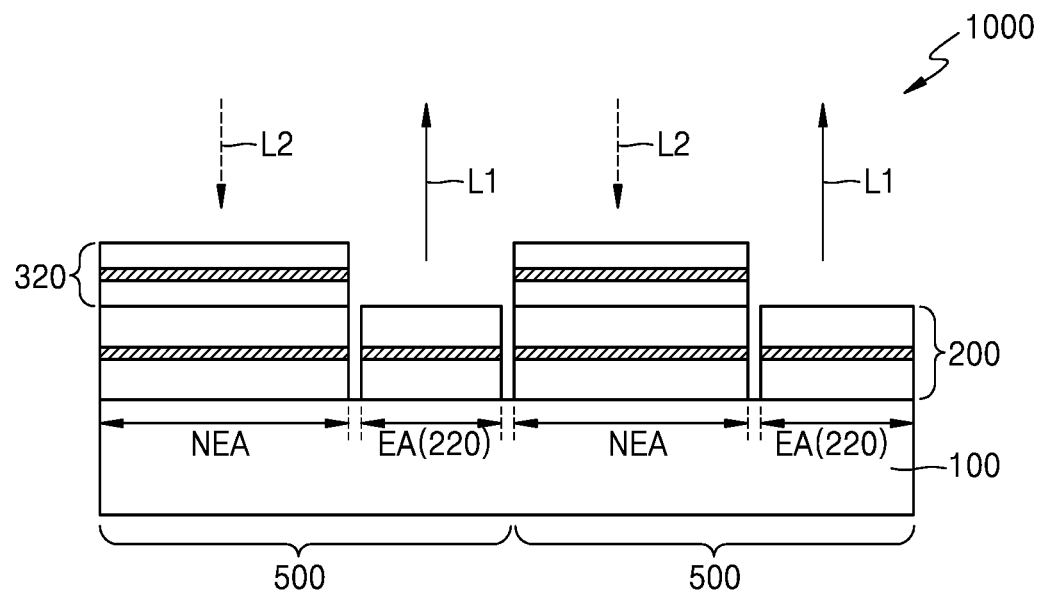
FIG. 3a is a cross-sectional view taken along A-A' to show a detailed configuration of a light receiving-emitting unit device included in the light sensing system of FIG. 2

FIG. 1 is a conceptual view of a light sensing system according to an exemplary embodiment, FIG. 2 is a plan view showing a schematic configuration of the light sensing system of FIG. 1, and FIG. 3a is a cross-sectional view taken along A-A' of FIG. 2 to show a detailed configuration of a light receiving-emitting unit device included in the light sensing system of FIG. 2.

A light sensing system 1000 is a light source-integrated light receiving system, and is proposed to improve the efficiency of the irradiation of light onto an object OBJ and the reception of light reflected from the object OBJ.

The light sensing system 1000 includes a plurality of light-emitting devices 220 and a plurality of light-receiving devices 320. The plurality of light-emitting devices 220 are disposed in an arrangement having a first optical axis OA1 and the plurality of light-receiving devices 320 are disposed in an arrangement having a second optical axis OA2.

In FIG. 1, for convenience of illustration, the first optical axis OA1 and the second optical axis OA2 are spaced apart from each other, and may be substantially parallel and substantially coaxial.

By arranging the plurality of light-emitting devices 220 and the plurality of light-receiving devices 320 such that the first optical axis OA1 and the second optical axis OA2 are substantially coaxial, the efficiency of light reception is improved. For purposes of this Application, the phrase "substantially coaxial" is not limited to an arrangement in which the first optical axial OA1 is completely identical to the second optical axis OA2. The term "substantially coaxial" may also refer to an arrangement, as shown in FIG. 2, in which the first optical axis OA1 and the second optical axis OA2 are disposed such that the efficiency of light reception is greater than or equal to a predetermined value. The predetermined value may be a value of light reception efficiency of the light sensing system 1000, the value being regarded as improved light reception efficiency compared to a system having a light source unit and a light receiver that are separated from each other or a system having different optical axes of the light source unit and the light receiver. Likewise, 'substantially parallel' is not limited to a meaning in which the direction of the first optical axis OA1 and the direction of the second optical axis OA2 are completely parallel to each other, and may include a meaning in which the directions are similar enough to each other to that the efficiency of light reception is greater than or equal to the predetermined value.

As shown in FIG. 2, the arrangement of the plurality of light-emitting devices 220 and the plurality of light-receiving devices 320 may have a form in which a plurality of light receiving-emitting unit devices 500 are repeatedly arranged. The light receiving-emitting unit devices 500 may each include one or more light-emitting devices 220 and one or more light-receiving devices 320. Although it is illustrated that one light-emitting device 220 and one light-receiving device 320 form a single light receiving-emitting unit device 500, this illustration is merely an example and the present disclosure is not limited to this illustration.

In this arrangement, the first optical axis OA1, which is a central axis of the arrangement of the plurality of light-emitting devices 220, and the second optical axis OA2, which is a central axis of the arrangement of the plurality of light-receiving devices 320, may be spaced apart from each other by a distance, having a central axis C of the arrangement of the plurality of light receiving-emitting unit devices 500 therebetween. Considering such an arrangement, the sentence "the first optical axis OA1 and the second optical axis OA2 are substantially coaxial to each other" may mean that the spacing distance between the first optical axis OA1 and the second optical axis OA2 is less than a width of one light receiving-emitting unit device 500. However, without being limited to this meaning, even when the spacing distance between the first optical axis OA1 and the second optical axis OA2 is greater than the width of one light receiving-emitting unit device 500, the first optical axis OA1 and the second optical axis OA2 may be "substantially coaxial" to each other, if the efficiency of light reception is greater than or equal to the predetermined value. Thus, when the spacing distance between the first optical axis OA1 and the second optical axis OA2 is less than a sum of widths of a plurality of light receiving-emitting unit devices 500 determined based on the efficiency of light reception, the first optical axis OA1 and the second optical axis OA2 may be "substantially coaxial" to each other.

To implement the light sensing system 1000 having such arrangement, the plurality of light-emitting devices 220 and the plurality of light-receiving devices 320 may be formed monolithically. The plurality of light-emitting devices 220 and the plurality of light-receiving devices 320 may be formed on a single substrate 100 in such a way to be monolithically integrated. This illustrative structure will be described with reference to FIGS. 3a and 3b.

Referring to FIG. 3a, the light sensing system 1000 may include the substrate 100, a light-emitting material layer 200 formed on the substrate 100, and the light-receiving device 320 formed on regions of the light-emitting material layer 200. The light-emitting material layer 200 includes light-emitting regions EA and non-emitting regions NEA, and the light-emitting regions EA may also be referred to as light-emitting devices 220 shown in FIG. 2.

The light sensing system 1000 includes a light receiving-emitting structure formed monolithically. That is, each of the light-emitting devices 220 and the light-receiving devices 320 are formed monolithically. Herein, "monolithically" means that the light-emitting device 220 and the light-receiving device 320 are not attached by means of coupling by transfer, adhesion, etc., to the substrate. For example, the light-emitting devices 220 and the light-receiving devices 320 may be formed directly on the substrate 100 by a series of sequential processes, e.g., a semiconductor process including deposition, photo-lithography, etching, and so forth, to form monolithically integrated structures on the substrate 100.

The light-emitting material layer 200 may include any of plurality of semiconductor materials, e.g., a III-V group semiconductor compound, a II-VI group semiconductor compound, and a IV-group semiconductor material. The light-emitting material layer 200 may have a laser structure including a gain layer, a clad layer, and a cavity, and may have, for example, a vertical cavity surface emitting laser (VCSEL) structure. The light-emitting material layer 200 may be formed on the substrate 100 by a semiconductor process, and the substrate 100 may be a semiconductor substrate that is suitable for formation of the semiconductor materials. For example, the substrate 100 may be a gallium arsenide (GaAs) substrate, a sapphire substrate, an Indium phosphide (InP) substrate, a silicon (Si) substrate, an insulator substrate, or the like. The light-emitting layer 200 may include aluminum gallium nitride (AlGaN), gallium indium nitride (GaInN), zinc sulfoselenide (ZnSSe), zinc cadmium selenide (ZnCDSe), aluminum gallium indium phosphide (AlGaInP)/GaAs, Ga0.5In0.5P/GaAs, gallium-aluminum-arsenide (GaAlAs)/GaAs, GaAs/GaAs, indium gallium arsenide (InGaAs)/GaAs, indium gallium arsenide phosphide (InGaAsP)/indium phosphide (InP), indium gallium arsenide antimonide (InGaAsSb), plumbum cadmium sulphide (PbCdS), quantum cascade, plumbum sulfoselenide (PbSSe), plumbum stannum telluride (PbSnTe), plumbum stannum selenide (PbSnSe), and the like. For example, AlGaN may be used to generate light having a wavelength band of 350 nm-400 nm. GaInN to generate light having a wavelength band of 375 nm-440 nm, ZnSSe to generate light having a wavelength band of 447 nm-480 nm, ZnCDSe to generate light having a wavelength band of 490 nm-525 nm, AlGaInP/GaAs to generate light having a wavelength band of 620 nm-6800 nm, Ga0.5In0.5P/GaAs to generate light having a wavelength band of 670 nm-680 nm, GaAlAs/GaAs to generate light having a wavelength band of 750 nm-900 nm, GaAs/GaAs to generate light having a wavelength of 904 nm, InGaAs/GaAs to generate light having a wavelength band of 915 nm-1050 nm, InGaAsP/InP to generate light having a wavelength band of 1100 nm-1650 nm, InGaAsSb to generate light having a wavelength band of 2 nm-5 nm, PbCdS to generate light having a wavelength band of 2.7 µm-4.2 µm, a Quantum cascade to generate light having a wavelength band of 3 µm-50 µm, PbSSe to generate light having a wavelength band of 4.2 πm-8 µm, PbSnTe to generate light having a wavelength band of 6.5 µm-30 µm, and PbSnSe to generate light having a wavelength band of 8 µm-30 µm may be used. The light-emitting material layer 200 may include a plurality of layers in which such materials are formed as a positive (P) type, an intrinsic (I) type, and a negative (N) type. The detailed composition of the semiconductor materials may be determined considering a desired wavelength band of the light L1 to be generated and emitted from the light-emitting region EA, i.e., the light-emitting device 220. The light-emitting material layer 200 is illustrated as including three layers, but is not limited to this illustration, and may include three or more layers. The light-emitting material layer 200 may include a mirror layer for forming a resonant structure. For example, a distributed Bragg reflector (DBR) including pairs, each having two materials having different refractive indices, may be provided to form a resonant cavity. The light-emitting material layer 200 may include an oxide aperture for controlling a mode or a beam size of oscillating light. The light-emitting material layer 200 may also include an electrode structure for electric current injection. To reduce a contact resistance with respect to an electrode, the light-emitting material layer 200 may further include a contact layer doped with P-type and N-type dopants at a high concentration.

The light-emitting material layer 200 includes the light-emitting region EA and the non-emitting region NEA. The non-emitting region NEA and the light-emitting region EA may include identical semiconductor materials. The light-emitting region EA is capable of emitting light to the outside. However, the entirety of the light-emitting region EA does not necessarily emit light. Rather, and at least a partial region of the light-emitting region EA emits light. The non-emitting region NEA is a region on which the light-receiving device 320 is formed and light is not emitted therefrom. The light-emitting region EAs and the non-emitting region NEAs may be different from each other in terms of the existence or absence of an electric current injection structure for light emission. For example, each light-emitting region EA may include an electrode (not shown) for electric current injection and the non-emitting regions NEA may not include electrodes. However, without being limited to this example, both the light-emitting regions EA and the non-emitting regions NEA may include similarly-structured electrodes, while the non-emitting regions NEA may be configured such that electric current is not be injected to electrodes of the non-emitting region NEAs—i.e. electrodes of the non-emitting regions NEA may not be connected to an external circuit.

The light-receiving device 320 formed on the non-emitting region NEA may be integrally formed directly on the light-emitting material layer 200. For example, a light-receiving material layer made of a semiconductor material may be formed on the entire surface of the light-emitting material layer 200 and may be patterned into a predetermined shape by a photo-lithography process, thereby forming the light-receiving device 320. The light-receiving device 320 may include, for example, a III-V group semiconductor compound, a II-VI group semiconductor compound, or a IV group semiconductor compound, and may include a photodiode. The light-receiving device 320 may include a plurality of layers in which the semiconductor materials are formed as a P type, an I type, and an N type. Although the light-receiving device 320 is illustrated as including three layers, this illustration is exemplary and the present disclosure is not limited thereto. The light-receiving device 320 may include not only the semiconductor materials, but also an electrode structure for detecting a light signal as an electric signal.

As stated above, the non-emitting region NEA and the light-emitting region EA are repeated alternately in the light-emitting material layer 200, and a unit structure including the light-emitting region EA and the non-emitting region NEA having the light-receiving device 320 thereon forms the integrated light receiving-emitting unit device 500.

Figure 3B:
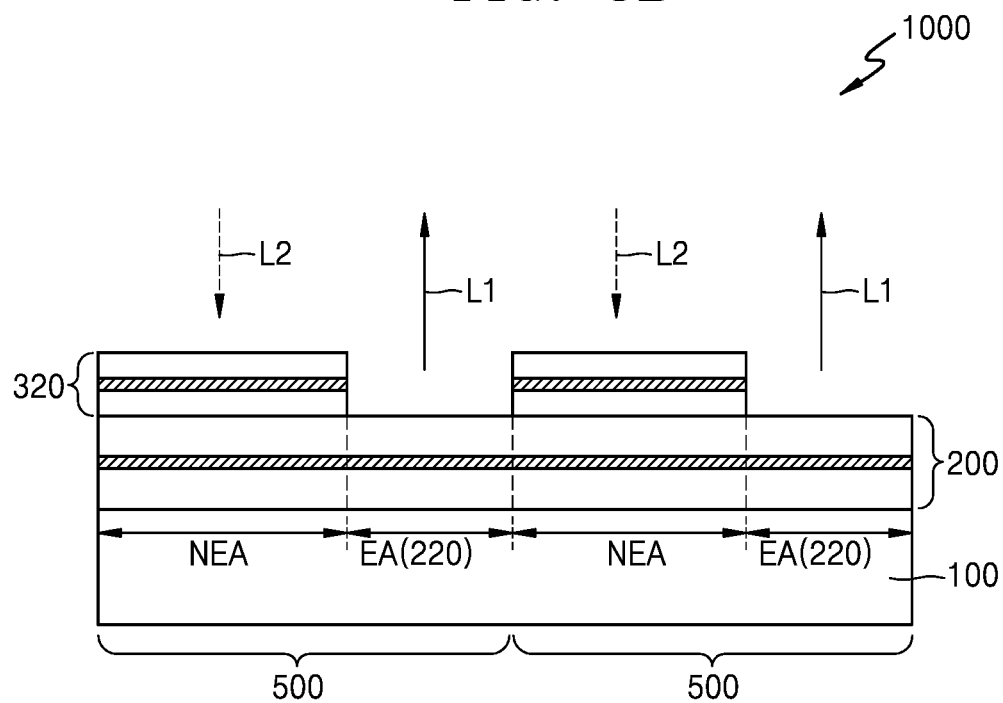

FIG. 3b shows modified example of FIG. 3a.

Figure 4A:
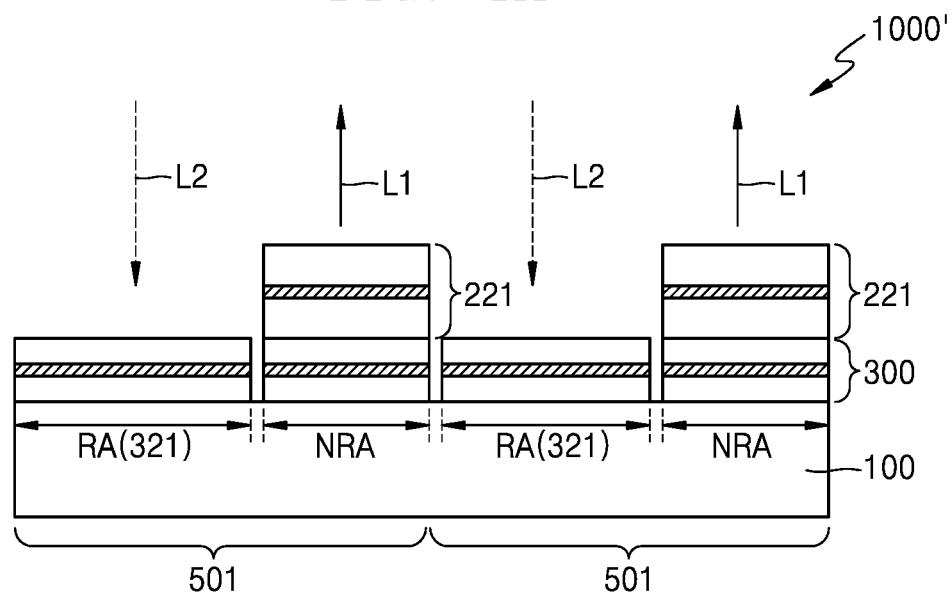

FIG. 4a is a cross-sectional view showing an example of a light receiving-emitting unit device included in a light sensing system according to another exemplary embodiment.

A light sensing system 1000' may have the same plan view as the light sensing system 1000 of FIG. 2, and FIG. 4a also corresponds to the cross-sectional view, taken along the line A-A' of FIG. 2.

The light sensing system 1000' may include the substrate 100, a light-receiving material layer 300 formed on the substrate 100, and a light-emitting device 221 formed on regions of the light-receiving material layer 300. The light-receiving material layer 300 includes light-receiving regions RA and non-receiving regions NRA, and the light-receiving regions RA may each be referred to as a light-receiving device 321.

The light-emitting devices 221 and the light-receiving devices 321 are formed directly on the substrate 100 by a series of sequential processes and each forms a monolithically integrated structure on the substrate 100, and a light receiving-emitting unit device 501 included in the light sensing system 1000' according to the current exemplary embodiment is different from the light receiving-emitting unit device 500 of FIGS. 3a and 3b in that the light-emitting device 221 is disposed on the light-receiving material layer 300.

The light-receiving material layer 300 may be formed on the substrate 100 by a semiconductor process. The light-receiving material layer 300 may include, for example, a III-V group semiconductor compound, a II-VI group semiconductor compound, or a IV group semiconductor compound, and may be integrally formed directly on the substrate 100. The light-receiving material layer 300 may be configured to implement one or more photodiodes. The substrate 100 may be a semiconductor substrate that is suitable for formation of the semiconductor material. For example, the substrate 100 may be a GaAs substrate, a sapphire substrate, an InP substrate, a Si substrate, an insulator substrate, or the like. Although the light-receiving material layer 300 is illustrated as including three layers, this illustration is exemplary and the present disclosure is not limited thereto. The light-receiving material layer 300 may include not only the semiconductor materials, but also an electrode structure for detecting a light signal as an electric signal.

The light-receiving material layer 300 may include light-receiving regions RA and non-receiving regions NRA. The non-receiving regions NRA and the light-receiving regions RA may include identical semiconductor materials. In the light-receiving material layer 300, the light-receiving regions RA are capable of converting light L2 incident from the outside into electric signals and outputting the electric signals, and the non-receiving regions NRA are regions on which the light-emitting devices 221 are formed and which do not output electric signals in response to the light L2 incident from the outside. The light-receiving regions RA and the non-receiving regions NRA may be different from each other in terms of the existence or absence of electrode structures for outputting electric signals. For example, the light-receiving regions RA may include electrodes (not shown) for outputting electric signals and the non-receiving regions NRA may not include electrodes. However, without being limited to this example, both the light-receiving regions RA and the non-receiving regions NRA may include electrode structures in the same manner, but electrodes of the non-receiving regions NRA may not be connected with an external circuit in terms of connection with the external circuit.

The light-emitting devices 221 formed on the non-receiving regions NRA may be monolithically formed directly on the light-receiving material layer 300. The light-emitting devices 221 may be formed on the light-receiving material layer 300 by a semiconductor process. For example, a light-emitting material layer made of a semiconductor material may be formed on the entire surface of the light-receiving material layer 300 and may be patterned into a predetermined shape by a photo-lithography process, thereby forming the light-emitting devices 221.

The light-emitting devices 221 may include any of a plurality of semiconductor materials, e.g., a III-V group semiconductor compound, a II-VI group semiconductor compound, and a IV-group semiconductor material. The light-emitting device 221 may include a plurality of layers in which such materials are of a P type, an N type, and an I type. The light-emitting devices 221 are illustrated as including three layers, but are not limited to this illustration, and may include three or more layers. The light-emitting devices 221 may each include a mirror layer for forming a resonant structure, an electrode structure for electric current injection, and a contact layer doped with P-type and N-type dopants at a high concentration to reduce a contact resistance with respect to an electrode. The light-emitting devices 221 may each have a laser structure and may have, for example, a VCSEL structure.

As stated above, the non-receiving regions NRA and the light-receiving regions RA are repeated alternately in the light-receiving material layer 300, and a unit structure including the light-receiving region RA, the non-receiving region NRA, and light-emitting device 221 on the non-receiving region NRA forms the integrated light receiving-emitting unit device 501.

Figure 4B:
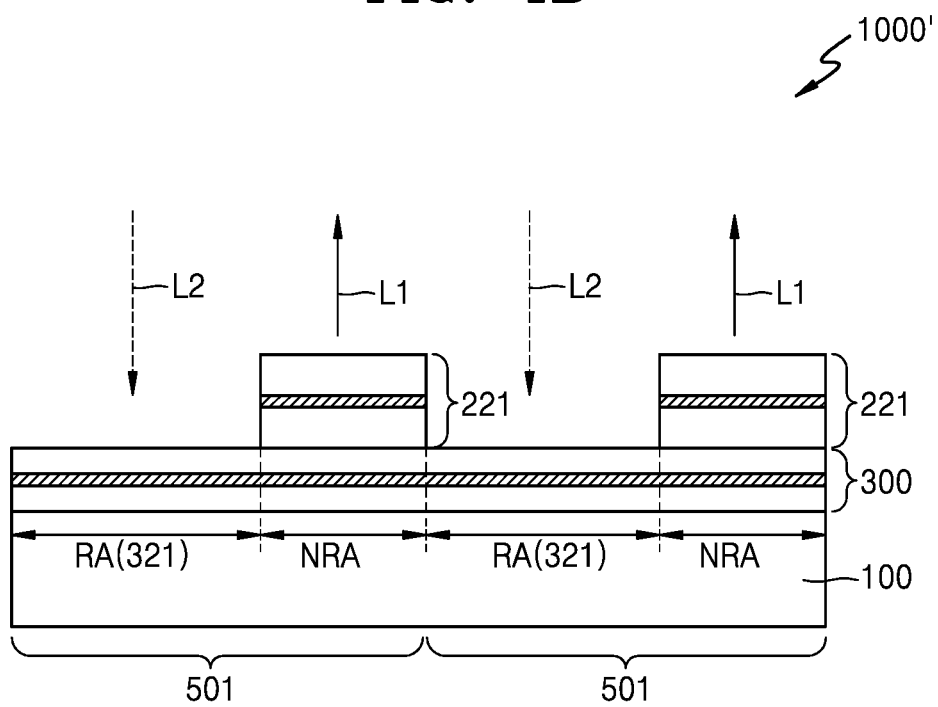

FIG. 4b shows modified example of FIG. 4a.

Figure 5:
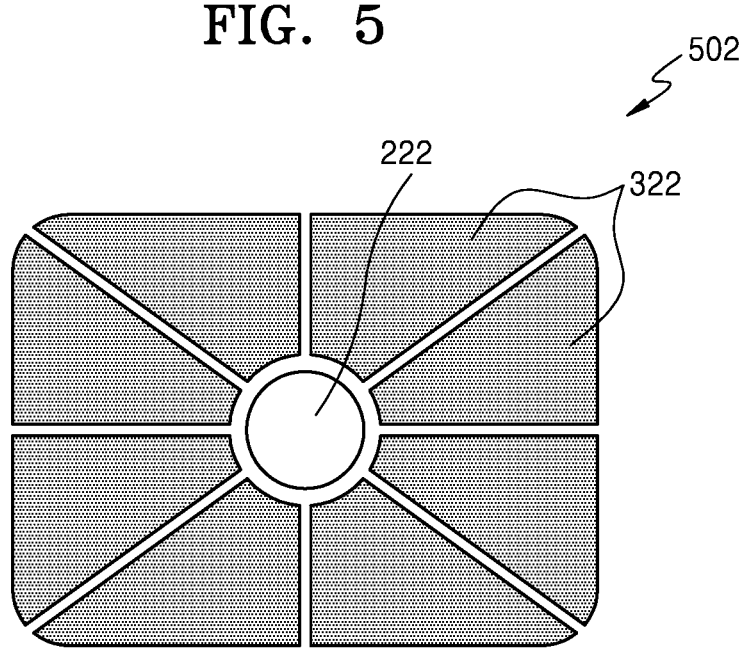
FIG. 5 is a plan view showing an example of a light receiving-emitting unit device included in a light sensing system according to another exemplary embodiment.

FIG. 5 is a plan view showing an example of a light receiving-emitting unit device included in a light sensing system according to another exemplary embodiment.

A light receiving-emitting unit device 502 may include a light-emitting device 222 and a plurality of light-receiving devices 322 surrounding the light-emitting device 222. The light-emitting device 222 may have a circular cross-section, and the plurality of light-receiving devices 322 may be disposed to surround the light-emitting device 222. As is shown, the light-receiving devices 322 may have a cross-section which surrounds the light-emitting device 222 and has an approximately rectangular shape that is equally divided into eight parts. However, this illustration is exemplary, and the cross-section of the light-receiving devices 322 may have a shape that a circular or oval shaped and is equally divided into a plurality of parts.

Figure 6:
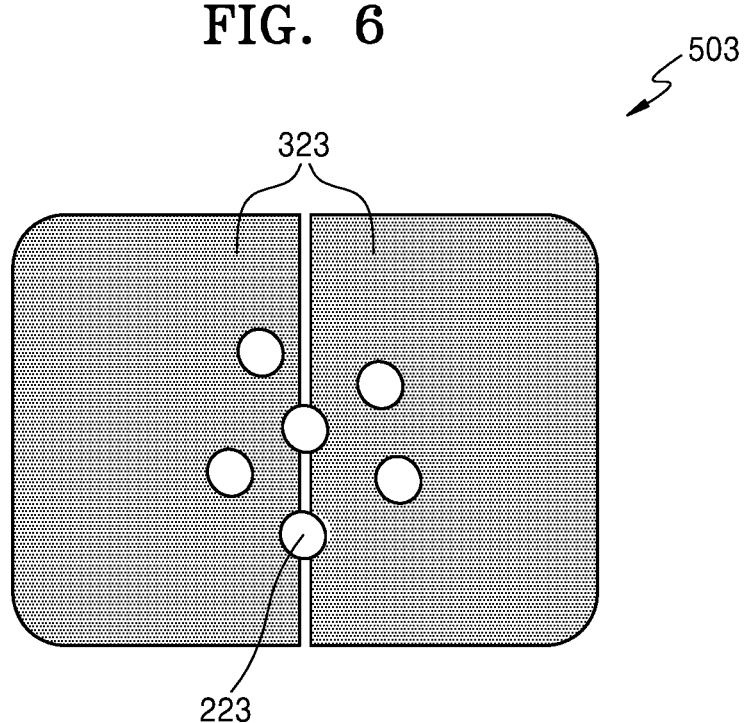
FIG. 6 is a plan view showing another light receiving-emitting unit device included in a light sensing system according to another exemplary embodiment.

FIG. 6 is a plan view showing another example of a light receiving-emitting unit device included in a light sensing system according to another exemplary embodiment.

A light receiving-emitting unit device 503 may include a plurality of light-emitting devices 223 and a plurality of light-receiving devices 323 surrounding the plurality of light-emitting device 223. The plurality of light-emitting devices 223 have circular cross-sections and are disposed in a central portion, and the plurality of light-receiving devices 323 have a shape which surrounds the plurality of light-emitting devices 223 and is an approximately rectangular shape that is equally divided into two parts. However, this illustration is exemplary, and the cross-section of the light-receiving devices 323 may have a circular or oval shape that is equally divided into two parts.

The cross-sectional shapes of the light receiving-emitting unit devices 502 and 503 shown in FIGS. 5 and 6, respectively, may adopt a form in which the light-receiving device 320 is formed on the light-emitting material layer 200 or in which the light-emitting device 221 is formed on the light-receiving material layer 300 as described with reference to the cross-sectional views of FIG. 3a or 3b or 4a or 4b.

The shapes illustrated for the light receiving-emitting unit devices 502 and 503 intend to describe that the area of the light-receiving region and the area of the light-emitting region may be configured freely depending on a need or convenience in the light sensing systems according to exemplary embodiments, and are not limited to the illustrated shapes.

Figure 7:
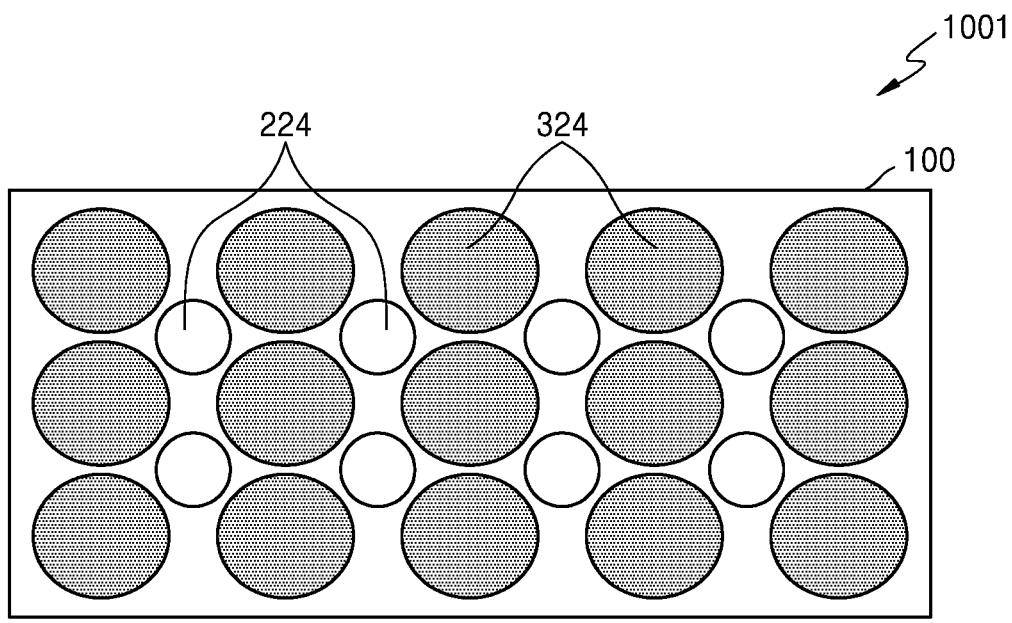
FIG. 7 is a plan view showing a schematic configuration of a light sensing system according to another exemplary embodiment.

FIG. 7 is a plan view showing a schematic configuration of a light sensing system according to another exemplary embodiment.

A light sensing system 1001 may include a plurality of light-emitting devices 224 and a plurality of light-receiving devices 324 which are integrally formed on the substrate 100. The plurality of light-emitting devices 224 and the plurality of light-receiving devices 324 may have circular cross-sectional shapes. The cross-section of each light-emitting device 224 may be smaller in size than that of each light-receiving device 324, such that each of the plurality of light-emitting devices 224 may be disposed in a space within an array of four of the plurality of light-receiving devices 324, as shown. The plurality of light-emitting devices 224 are arranged in two directions parallel to the directions of the light-receiving devices 324 in an alternate manner. Such arrangement may improve the efficiency of light reception by increasing a fill factor of the light-receiving device 324.

Figure 8:
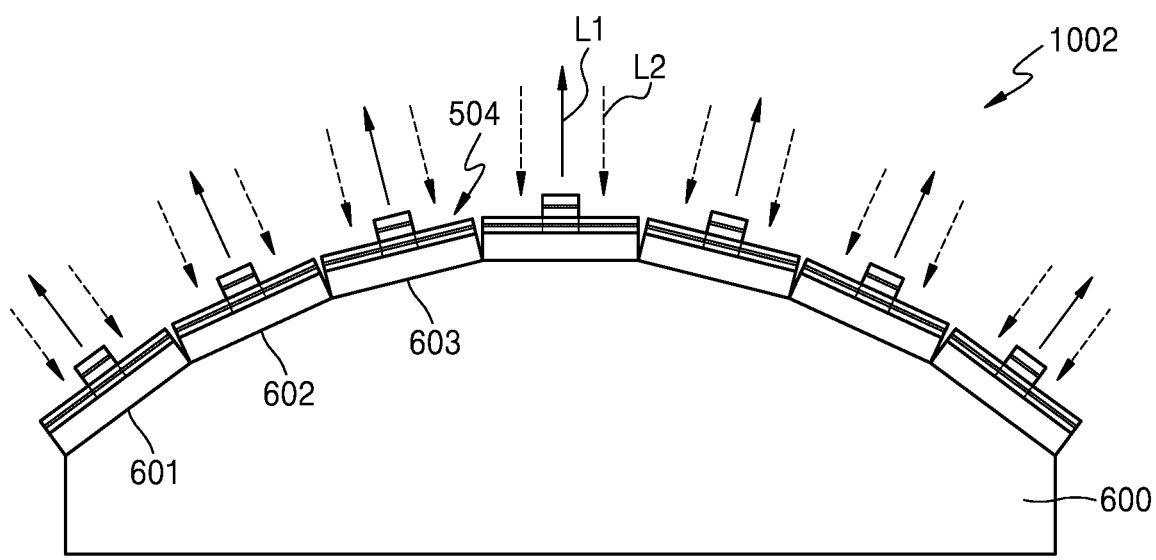
FIG. 8 is a cross-sectional view showing a schematic configuration of a light sensing system according to another exemplary embodiment.
Figure 10:
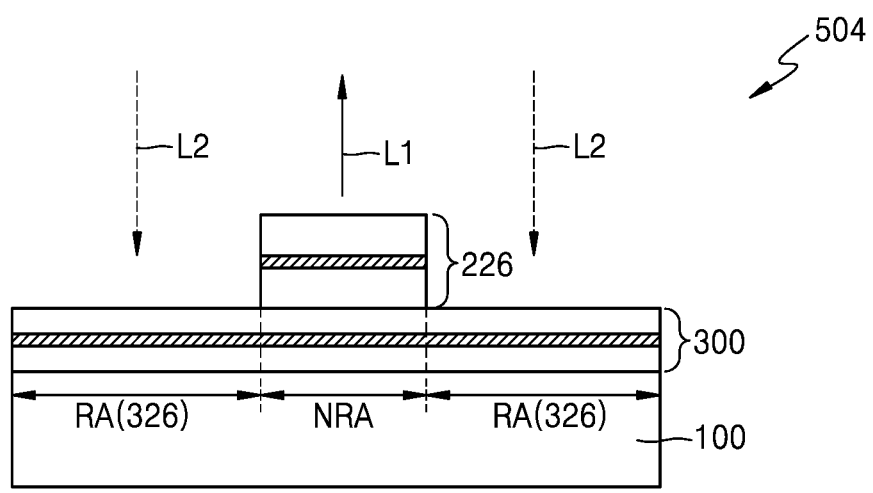
FIG. 10 is a cross-sectional view showing a modified example of the light receiving-emitting unit device included in the light sensing system of FIG. 8.

FIG. 8 is a cross-sectional view showing a schematic configuration of a light sensing system according to another exemplary embodiment, and FIG. 10 is a cross-sectional view showing a detailed configuration of a light receiving-emitting unit device included in the light sensing system of FIG. 8.

A light sensing system 1002 may further include a support structure 600 for widening a viewing angle, and a plurality of light receiving-emitting unit devices 504 may be disposed on the support structure 600.

Each light receiving-emitting unit device 504 may include a light-receiving material layer 300 which is formed on the substrate 100 and includes light-receiving regions RA and a non-receiving region NRA, and a light-emitting device 226 formed on the non-receiving region NRA. Each light-receiving region RA is a light-receiving device 326. The light receiving-emitting unit device 504 used in the light sensing system 1002 according to the current exemplary embodiment is substantially the same as the light receiving-emitting unit device 501 described with reference to FIGS. 4a and 4b except for the number and arrangement of light-receiving devices 326 forming the unit structure. Materials or structures of the light-receiving material layer 300, the light-receiving region RA, the non-receiving region NRA, and the light-emitting device 226 are substantially the same as described with reference to FIGS. 4a and 4b. The light-receiving material layer 300 may include the light-receiving regions RA and the non-receiving regions NRA. A unit structure in which two light-receiving regions RA, i.e., two light-receiving devices 326, are formed at both sides of a non-receiving region NRA, and the light-emitting device 226 is formed on the non-receiving region NRA, forms the integrated light receiving-emitting unit device 504.

The support structure 600 includes a surface on which the plurality of light receiving-emitting unit devices 504 are arranged. The shape of the surface may be set such that an optical axis of each of the plurality of light receiving-emitting unit devices 504 has a different direction depending on a position on the surface.

For example, the support structure 600 may have a flat bottom surface and a plurality of inclined surfaces 601, 602, and 603 having different angles with respect to the bottom surface. The light receiving-emitting unit devices 504 disposed on the inclined surfaces 601, 602, and 603, respectively, emit light in different directions according to the angles of the inclined surfaces 601, 602, and 603, such that the viewing angle of the light sensing system 1002 may be widened. That is, the light sensing system 1002 may emit the light L1 to provide a wide viewing angle and receive the light L2 incident at the wide viewing angle.

Figure 9:
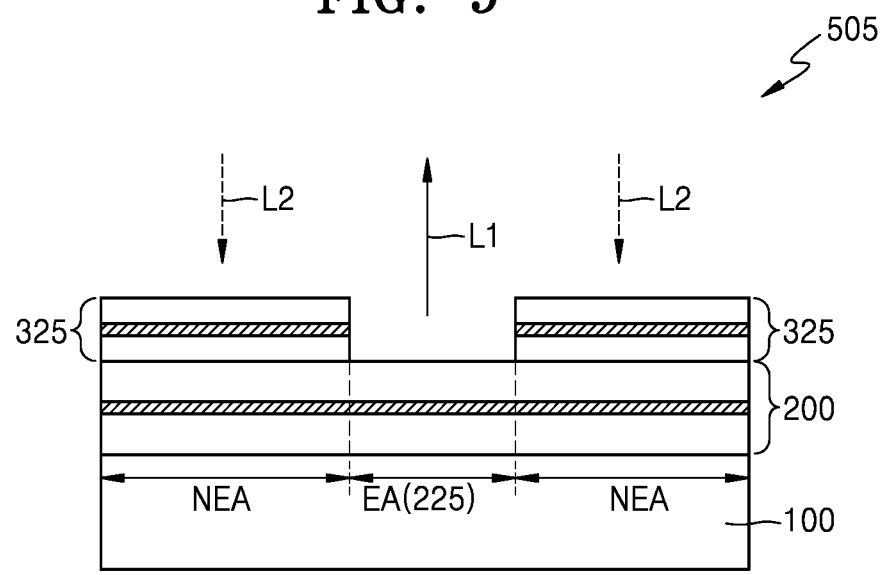
FIG. 9 is a cross-sectional view showing a detailed configuration of a light receiving-emitting unit device included in the light sensing system of FIG. 8.

FIG. 9 is a cross-sectional view of a modified light receiving-emitting unit device 505 which may be provided in the light sensing system 1002 of FIG. 8.

The light receiving-emitting unit device 505 may include a light-emitting material layer 200 which is formed on the substrate 100 and includes a light-emitting region EA and non-emitting regions NEA, and light-receiving devices 325 formed on the non-emitting regions NEA. The light-emitting region EA is a light-emitting device 225.

The light receiving-emitting unit device 505 is substantially the same as the light receiving-emitting unit device 500 described with reference to FIGS. 3a and 3b except for the number and arrangement of light-receiving devices 325 forming the unit structure. Materials or structures of the light-emitting material layer 200, the light-emitting region EA, the non-emitting regions NEA, and the light-receiving devices 325 are substantially the same as described with reference to FIGS. 3a and 3b. The light-emitting material layer 200 has the light-emitting region EA and the non-emitting regions NEA. As stated above, a unit structure in which the non-emitting regions NEA are formed at both sides of the light-emitting region EA, that is, the light-emitting device 225 and the light-receiving devices 325 are formed on the two non-emitting regions NEA forms the integrated light receiving-emitting unit device 505. The light receiving-emitting unit device 505 may be formed on the support structure 600 described with reference to FIG. 8, and may implement a wide viewing angle.

Figure 11:
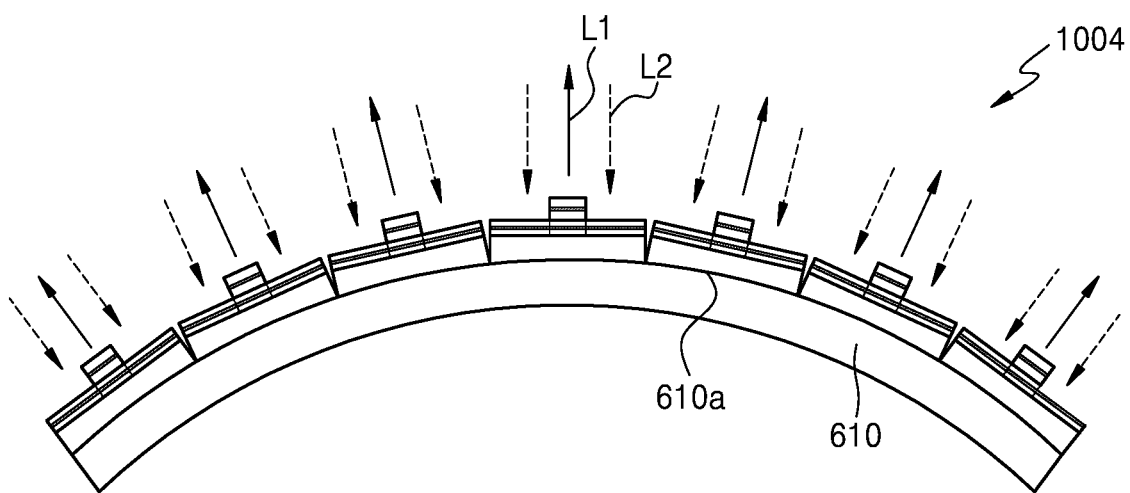
FIG. 11 is a cross-sectional view showing a schematic configuration of a light sensing system according to another exemplary embodiment.

FIG. 11 is a cross-sectional view showing a schematic configuration of a light sensing system according to another exemplary embodiment.

A light sensing system 1004 may include a support structure 610 for widening a viewing angle. The support structure 610 provided in the light sensing system 1004 according to the current exemplary embodiment may have a curved surface 610a on which the light receiving-emitting unit devices 504 are disposed. The support structure 610 may have a shape in which a flat plate is bent as shown in FIG. 11. As the surface 610a has a curved shape, the direction of the light L1 emitted from the light receiving-emitting unit device 504 disposed on the surface 610a varies with a position of the light receiving-emitting unit device 504, thus emitting the light L1 at a wide viewing angle. Likewise, the light L2 incident at the wide viewing angle may be received. The curved shape of the support surface 610 may be formed to form a desired viewing angle by adjusting a degree to which the flat plate is bent.

Figure 12:
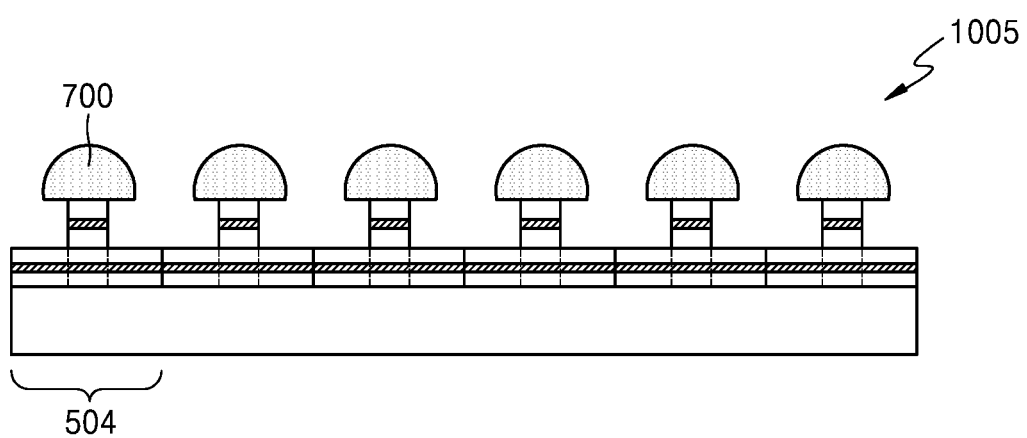
FIG. 12 is a cross-sectional view showing a schematic configuration of a light sensing system according to another exemplary embodiment.

FIG. 12 is a cross-sectional view showing a schematic configuration of a light sensing system according to another exemplary embodiment.

A light sensing system 1005 may include a plurality of light receiving-emitting unit devices 504 arranged repeatedly, on each of which a lens structure 700 for adjusting an emitting angle is further formed. Each light receiving-emitting unit device 504 will be described as having, but not limited to, the shape illustrated in FIG. 9. The lens structure 700 may be formed on the light-emitting device 226 of the light receiving-emitting unit device 504. The lens structure 700 may be formed of a transparent material having a refractive index and the shape of a lens surface, and may adjust the emitting angle of light emitted from the light receiving-emitting unit device 504 in a desired form.

Figure 13:
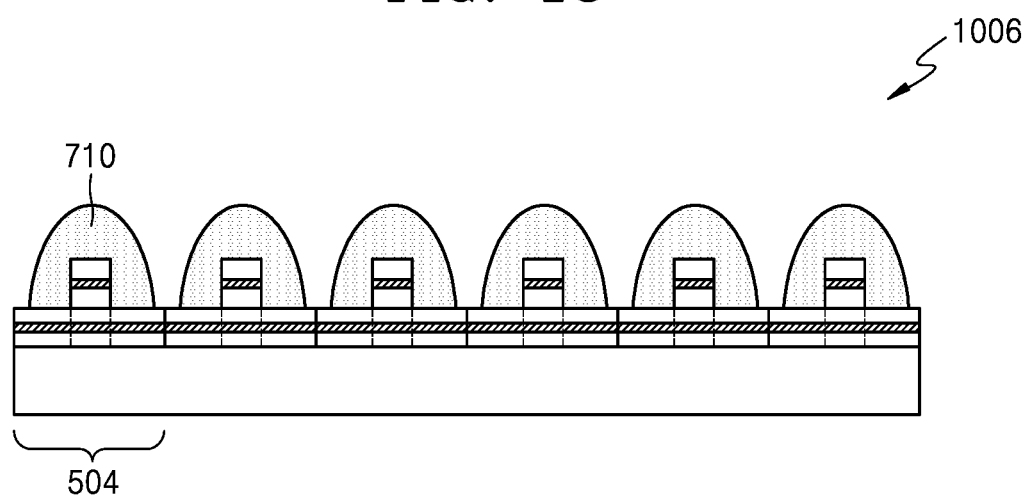
FIG. 13 is a cross-sectional view showing a schematic configuration of a light sensing system according to another exemplary embodiment.

FIG. 13 is a cross-sectional view showing a schematic configuration of a light sensing system according to another exemplary embodiment.

A light sensing system 1006 according to the current exemplary embodiment is different from the light sensing system 1005 of FIG. 12 in that a lens structure 710 adjusts not only the emitting angle of light emitted from the light receiving-emitting unit device 504, but also the incident angle of light incident onto the light receiving-emitting unit devices 504. The lens structure 710 may have a form for covering one light receiving-emitting unit device 504 as a whole, that is, both the light-emitting device 226 and the two light-receiving devices 326.

Figure 14:
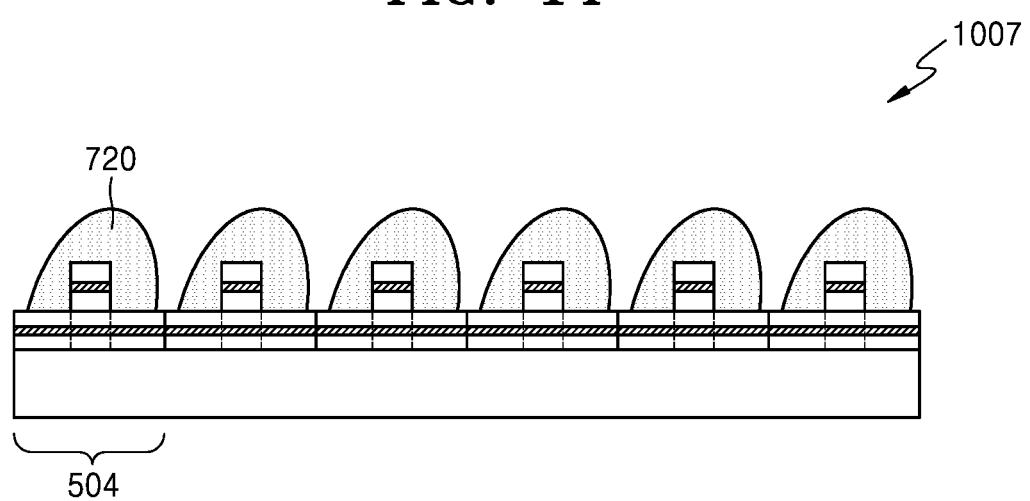
FIG. 14 is a cross-sectional view showing a schematic configuration of a light sensing system according to another exemplary embodiment.

FIG. 14 is a cross-sectional view showing a schematic configuration of a light sensing system according to another exemplary embodiment.

A light sensing system 1007 according to the current exemplary embodiment is different from the light sensing system 1006 of FIG. 13 in terms of the shape of a lens structure 720. The lens structure 720 has a form capable of adjusting the emitting angle of light from the light-emitting device 226 and the incident angle of light to the light-receiving device 326.

Figure 15:
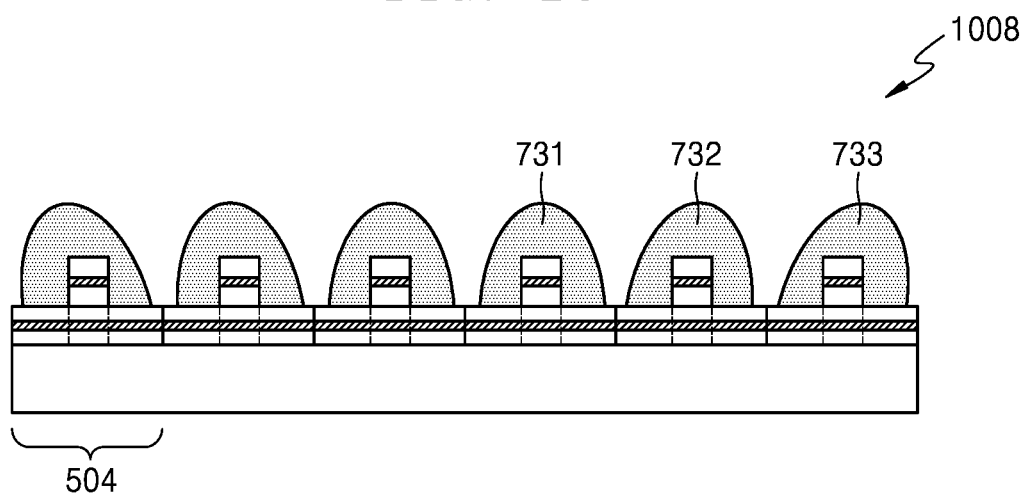
FIG. 15 is a cross-sectional view showing a schematic configuration of a light sensing system according to another exemplary embodiment.

FIG. 15 is a cross-sectional view showing a schematic configuration of a light sensing system according to another exemplary embodiment.

A light sensing system 1008 according to the current exemplary embodiment is different from the light sensing system 1007 of FIG. 14 in that a lens structure has a shape for adjusting an emitting angle and an incident angle in different directions depending on a relative position of each of the plurality of light receiving-emitting unit devices 504.

With respect to a lens structure 731 formed on the light receiving-emitting unit device 504 relatively located in a central portion, shapes of lens structures 732 and 733 are determined such that a direction for adjusting an emitting angle and an incident angle is gradually inclined from the center portion to an edge portion. Thus, a wider viewing angle may be implemented.

Figure 16:
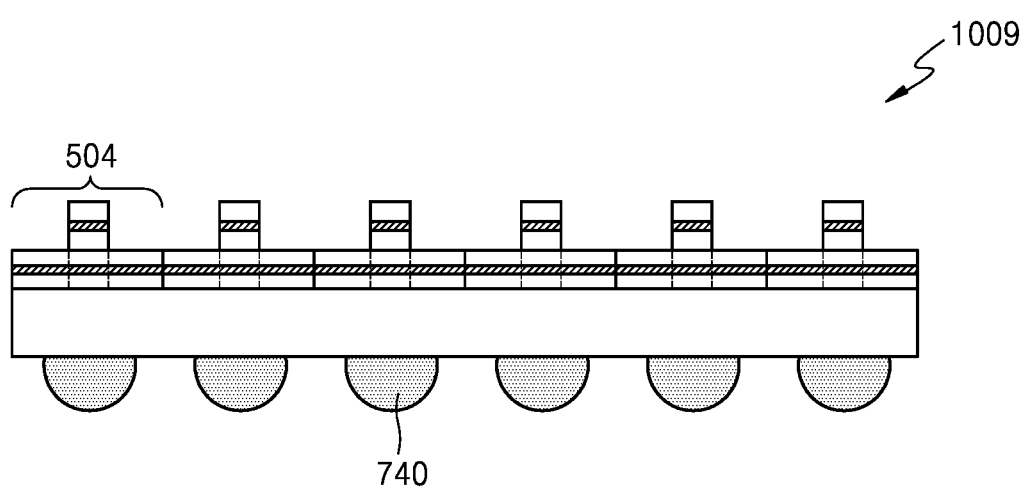
FIG. 16 is a cross-sectional view showing a schematic configuration of a light sensing system according to another exemplary embodiment.

FIG. 16 is a cross-sectional view showing a schematic configuration of a light sensing system according to another exemplary embodiment.

A light sensing system 1009 according to the current exemplary embodiment is different from the foregoing embodiments in that a lens structure 740 is formed on a bottom surface of the substrate 100.

Although the lens structures 740 on the bottom surface of the substrate 100 are illustrated as having identical shapes, the present disclosure is not limited to this example. For example, a lens surface shape may be changed into a shape inclined in a direction with respect to a central axis as described with reference to FIG. 14, or the central axis of the lens surface shape may be gradually inclined from the central portion to the edge portion as described with reference to FIG. 15.

Although the light receiving-emitting unit device 504 shown in FIGS. 12 through 16 is illustrated as having the shape described with reference to FIG. 9, the present disclosure is not limited to this example, and the light receiving-emitting unit device 504 may be changed to the shape of the light receiving-emitting unit device 504 described with reference to FIG. 9 or to other similar shapes.

The light-emitting devices provided in the light sensing systems according to the foregoing exemplary embodiments may include a plurality of light-emitting devices for emitting light having different wavelengths. For example, a multi-wavelength light sensing system may be implemented, which includes a first light-emitting device for emitting light having a first wavelength band and a second light-emitting device for emitting light having a second wavelength band, the second wavelength band being different from the first wavelength band. The light having different wavelength bands may be formed by adjusting a composition ratio of semiconductor materials of a light-emitting material layer. To form light having different wavelengths, each light receiving-emitting unit device may be configured with a plurality of types and such light receiving-emitting unit devices may be repeatedly arranged in an alternate manner.

The light sensing systems according to the foregoing embodiments may be employed in any of various optical devices and electronic devices.

Figure 17:
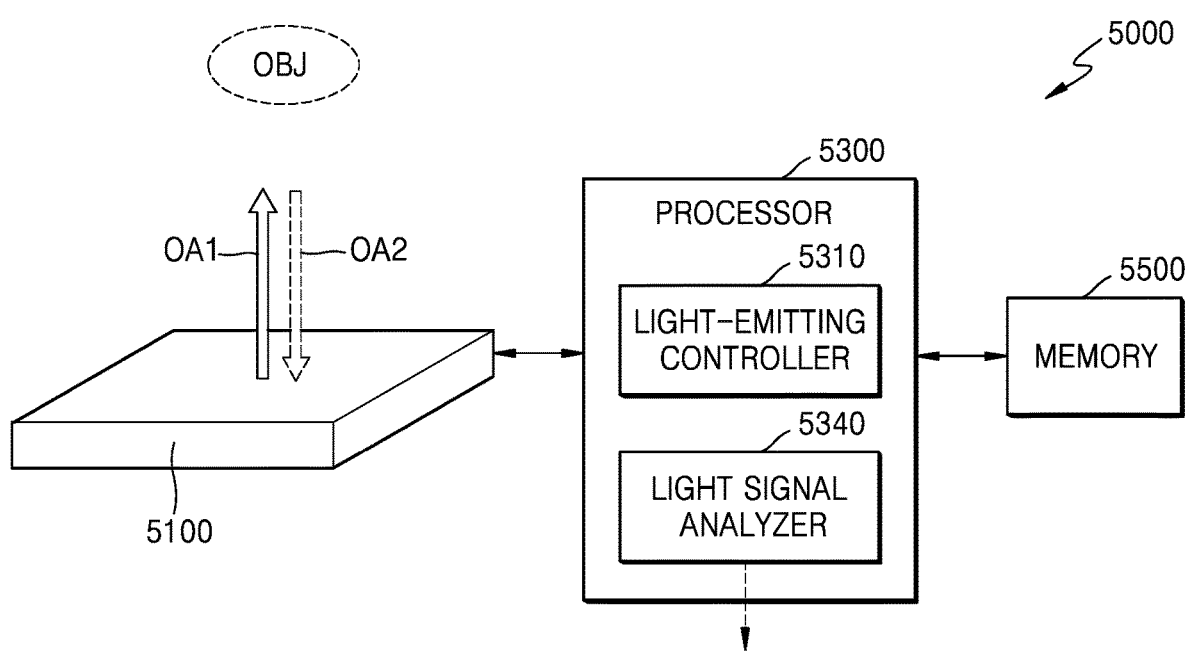
FIG. 17 is a block diagram showing a schematic configuration of a light detection and ranging (LiDAR) device according to an exemplary embodiment.

FIG. 17 is a block diagram showing a schematic configuration of a LiDAR device according to an exemplary embodiment.

A LiDAR device 5000 may include a light sensing system 5100 and a processor 5310 that controls the light sensing system 5100 and analyzes light received from the light sensing system 5100.

The light sensing system 5100 may be any one of the light sensing systems 1000, 1001, 1002, 1003, 1004, 1005, 1006, 1007, 1008, and 1009 according to the above-described exemplary embodiments, a combination thereof, or a modified form thereof. A light receiving-emitting unit device included in the light sensing system 5100 may also be any one of the above-described light receiving-emitting unit devices 500, 501, 502, 503, 504, and 505, a combination thereof, or a modified form thereof.

The light sensing system 5100 is a light sensing system in which a light source is integrated, and includes a plurality of light-emitting devices for irradiating light toward an object OBJ and a plurality of light-receiving devices for receiving reflected light toward the object OBJ, in which the plurality of light-emitting devices are arranged to have the first optical axis OA1, the plurality of light-receiving devices are arranged to have the second optical axis OA2, and the first optical axis OA1 and the second optical axis OA2 are parallel to each other and may be substantially coaxial to each other. The plurality of light-emitting devices and the plurality of light-receiving devices may have a monolithically integrated structure.

The light-emitting structure provided in the light sensing system 5100 may generate and emit light to be used for analyzing a position and a shape of the object OBJ. The light-emitting device may generate light having a wavelength band that is suitable for analysis of the position and the shape of the object OBJ, e.g., light having a wavelength in an infrared band. The light-emitting device provided in the light sensing system 5100 may include a plurality of light-emitting devices for generating light in different wavelength bands. For example, the light sensing system 5100 may include the first light-emitting device for emitting light in a first wavelength band and the second light-emitting device for emitting light in a second wavelength band, the second wavelength band being different from the first wavelength band. The number of wavelength bands is not limited to this example, and light-emitting devices for generating light having various types of wavelength bands may be included in the light sensing system 5100.

The processor 5300 controls an overall operation of the LiDAR device 5000, and may include a light emission controller 5310 and a light signal analyzer 5340.

The light emission controller 5310 controls light-emitting devices of the light sensing system 5100. For example, the light emission controller 5310 may perform power supply control, on/off control, pulse wave (PW) or continuous wave (CW) generation control, and so forth with respect to the light-emitting device. The light emission controller 5310 may control the light sensing system 5100 to cause a plurality of light-emitting devices provided in a plurality of light sensing systems 5100 to simultaneously emit light (a flash type). The light emission controller 5310 may control the light sensing system 5100 such that a plurality of light-emitting devices provided in the light sensing system 5100 emit light with a time difference therebetween. When the wavelength band of the light sensing system 5100 is such that a plurality of different types of light-emitting devices are used, for example, the first light-emitting device for emitting light having the first wavelength band and the second light-emitting device for emitting light having the second wavelength band, the light emission controller 5310 controls the light sensing system 5100 such that the first light-emitting device and the second light-emitting device emit light at different times. The light emission controller 5310 controls the light sensing system 5100 to select and drive a light-emitting device for emitting light having a particular wavelength band from among a plurality of wavelength bands, depending on a desired use.

The light sensing system 5100 includes an array of light-receiving devices for sensing light reflected from the object OBJ, and thus receives light which is reflected from the object OBJ after being irradiated from the light sensing system 5100. The received light signal may be used to analyze existence, a position, a shape, a physical property, etc., of the object OBJ.

The light signal analyzer 5340 may analyze a light signal received by the light sensing system 5100 from the object OBJ to analyze the existence, position, shape, physical property, etc., of the object OBJ. The light signal analyzer 5340 may perform an operation for, for example, time of flight measurement, and identify a three-dimensional (3D) shape of the object OBJ based on the calculation or perform physical property analysis using Raman analysis. The light signal analyzer 5340 may also analyze a type, an ingredient, a concentration, the physical property, etc., of the object OBJ by using Raman analysis that detects wavelength shift caused by the object OBJ.

The light signal analyzer 5340 may use any of various operation methods. For example, when a direct time measurement is used pulse light is irradiated to the object OBJ and the time of arrival of the light is measured after being reflected from the object OBJ by using a timer, thus calculating a distance. When a correlation is used, the pulse light is irradiated to the object OBJ and the distance is measured from a brightness of the light reflected from the object OBJ. When a phase delay measurement is used light having a continuous wave, such as a sine wave, is irradiated onto the object OBJ, and a phase difference of the light reflected from the object OBJ is sensed, thus converting the phase difference into the distance.

The LiDAR device 5000 may include a memory 5500 in which a program necessary for the operation and other data is stored.

The light signal analyzer 5340 transmits an operation result, that is, information about the shape, position, and physical property of the object OBJ, to another unit. For example, the information may be transmitted to an autonomous driving device that needs information about a 3D shape, operation, and position of the object OBJ. The information may also be transmitted to a medical equipment using physical property information of the object OBJ, e.g., biometric information. The other unit to which the operation result is transmitted may be a display device or a printer. In addition, the other unit may also be, but not limited to, a smart phone, a cellular phone, a personal digital assistant (PDA), a laptop, a personal computer (PC), and other mobile or non-mobile computing devices.

The LiDAR device 5000 may be used as a sensor for obtaining 3D information about a front object in real time, thus being applicable to a self-driving device, e.g., a unmanned vehicle, a self-driving vehicle, a robot, a drone, etc., and to a small-size walking means (e.g., a bicycle, a motor cycle, a stroller, a board, etc.), a person and animal assisting means (e.g., a walking stick, a helmet, clothes, accessories, a watch, a bag, etc.), Internet of Things (IoT) devices, building security devices, and so forth.

The above-described light sensing system has a structure in which the light resource unit and the light-receiving unit are integrated, thus simplifying the system.

In the above-described light sensing system, the plurality of light-emitting devices and the plurality of light-receiving devices are arranged such that the optical axis of the light source unit and the optical axis of the light-receiving unit are substantially coaxial to each other, thereby improving the efficiency of light reception.

The above-described light sensing system may be used in any of various optical devices and electronic devices, and may be employed in the LiDAR system to obtain information about the object.

While the light sensing system and the LiDAR device including the same have been shown and described in connection with the exemplary embodiments, it will be apparent to those of ordinary skill in the art that modifications and variations can be made without departing from the spirit and scope of the exemplary embodiments as defined by the appended claims. Therefore, the disclosed embodiments should be considered in an illustrative sense rather than a restrictive sense. The range of the exemplary embodiments will be in the appended claims, and all of the differences in the equivalent range thereof should be understood to be included in the exemplary embodiments.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A light sensing system comprising:
a substrate;
a plurality of light-emitting devices disposed on the substrate;
a plurality of light-receiving devices disposed on the substrate; and
a plurality of light receiving-emitting unit devices, each of the plurality of light receiving-emitting unit devices comprising at least one of the plurality of light-emitting devices and at least one of the plurality of light-receiving devices,
wherein each of the plurality of light receiving-emitting unit devices comprises:
a light-emitting material layer which is formed on the substrate and comprises a light-emitting region comprising at least one light-emitting device and a non-emitting region,
wherein the non-emitting region comprises a same material as a material of the at least one light-emitting device, and
wherein at least one light-receiving device is formed on the non-emitting region.

2. The light sensing system of claim 1, wherein the plurality of light-emitting devices and the plurality of light-receiving devices have a monolithically integrated structure.

3. The light sensing system of claim 1, wherein each of the plurality of light receiving-emitting unit devices comprises a plurality of light-receiving devices surrounding the at least one light-emitting device.

4. A light sensing system comprising:
a substrate;
a plurality of light-emitting devices disposed on the substrate;
a plurality of light-receiving devices disposed on the substrate; and
a plurality of light receiving-emitting unit devices, each of the plurality of light receiving-emitting unit devices comprising at least one of the plurality of light-emitting devices and at least one of the plurality of light-receiving devices,
wherein each of the plurality of light receiving-emitting unit devices comprises:
a light-receiving material layer which is formed on the substrate and comprises a light-receiving region comprising at least one light-receiving device and a non-receiving region,
wherein the non-receiving region comprises a same material as a material of the at least one light-receiving device, and
wherein at least one light-emitting device is formed on the non-receiving region.

5. The light sensing system of claim 1, further comprising a lens structure positioned on the plurality of light receiving-emitting unit devices, wherein the lens structure is configured to adjust an angle of light emitted from the at least one light-receiving device.

6. The light sensing system of claim 5, wherein the lens structure is further configured to adjusts an angle of light incident on the at least one light-receiving device.

7. The light sensing system of claim 5, wherein a shape of the lens structure is configured to control angles at which light is emitted from each of the plurality of light receiving-emitting unit devices, depending on a relative position of each of the plurality of light receiving-emitting unit devices.

8. The light sensing system of claim 1, further comprising a support structure comprising a surface on which the plurality of light receiving-emitting unit devices are arranged, wherein a shape of the surface is configured such that a direction of an optical axis of each of the plurality of light receiving-emitting unit devices differs with respect a position on the surface.

9. The light sensing system of claim 8, wherein the surface comprises one of a curved surface and a surface comprising a plurality of inclined surfaces.

10. The light sensing system of claim 1, wherein the plurality of light-emitting devices comprise:
   a first light-emitting device configured to emit light in a first wavelength band; and
   a second light-emitting device configured to emit light in a second wavelength band, different from the first wavelength band.

11. A light detection and ranging (LiDAR) device comprising:
   the light sensing system of claim 1; and
   a processor configured to control the light sensing system and to analyze light received from the light sensing system.

12. The LiDAR device of claim 11, wherein the plurality of light-emitting devices and the plurality of light-receiving devices have a monolithically integrated structure.

13. The LiDAR device of claim 11, wherein the processor is further configured to control the light sensing system such that the plurality of light-emitting devices emit light at different times.

14. The LiDAR device of claim 11, wherein the processor is further configured to control the light sensing system such that all of the plurality of light-emitting devices emit light at the same time.

15. The LiDAR device of claim 11, wherein the plurality of light-emitting devices comprise:
   a first light-emitting device configured to emit light in a first wavelength band; and
   a second light-emitting device configured to emit light in a second wavelength band, different from the first wavelength band.

16. The LiDAR device of claim 15, wherein the processor is further configured to control the light sensing system such that the first light-emitting device and the second light-emitting device emit light at different times.

17. A light detection and ranging (LiDAR) device comprising:
   a light sensing system of claim 4; and
   a processor configured to control the light sensing system and to analyze light received from the light sensing system.

18. An electronic device comprising the LiDAR device of claim 11.

19. An electronic device comprising the LiDAR device of claim 17.

* * * * *